United States Patent
Verneer et al.

(10) Patent No.: US 10,996,381 B2
(45) Date of Patent: May 4, 2021

(54) LIGHT BEAM DIFFUSER SYSTEM AND METHOD

(71) Applicant: Kulicke & Soffa Liteq B.V., Eindhoven (NL)

(72) Inventors: Adrianus Johannes Verneer, Eindhoven (NL); Mikhail Yurlevitch Loktev, Eindhoven (NL); Derk Andre Kort, Eindhoven (NL)

(73) Assignee: KULICKE & SOFFA LITEQ B.V., Eindhoven (NL)

( * ) Notice: Subject to any disclaimer, the term of this patent is extended or adjusted under 35 U.S.C. 154(b) by 73 days.

(21) Appl. No.: 16/613,308

(22) PCT Filed: May 15, 2018

(86) PCT No.: PCT/NL2018/050318
§ 371 (c)(1),
(2) Date: Nov. 13, 2019

(87) PCT Pub. No.: WO2018/212646
PCT Pub. Date: Nov. 22, 2018

(65) Prior Publication Data
US 2020/0150318 A1    May 14, 2020

(30) Foreign Application Priority Data
May 16, 2017    (NL) ..................... 2018926

(51) Int. Cl.
*G03F 7/20* (2006.01)
*G02B 5/02* (2006.01)

(52) U.S. Cl.
CPC ......... *G02B 5/0263* (2013.01); *G02B 5/0278* (2013.01); *G03F 7/70075* (2013.01); *G03F 7/70583* (2013.01)

(58) Field of Classification Search
CPC . G02B 5/0263; G02B 5/0278; G03F 7/70058; G03F 7/70075; G03F 7/70191; G03F 7/70583; G03F 7/70825
(Continued)

(56) References Cited

U.S. PATENT DOCUMENTS

| 7,148,952 B2 | 12/2006 | Eurlings et al. |
| 2001/0055081 A1* | 12/2001 | Shigeta .................. G09G 3/002 349/106 |

(Continued)

FOREIGN PATENT DOCUMENTS

CN    106444246    2/2017

OTHER PUBLICATIONS

International Search Report completed on Aug. 9, 2018, International Application No. PCT/NL2018/050318.

*Primary Examiner* — Colin W Kreutzer
(74) *Attorney, Agent, or Firm* — Christopher M. Spletzer, Sr.

(57) ABSTRACT

A diffuser system (100) and method for optically diffusing a light beam (L1,L2). At least two transmissive diffuser windows (11,21) are provided. The diffuser windows (11,21) are arranged to sequentially diffuse the light beam (L1,L2) transmitted there through. The diffuser system (100) is configured to continuously rotate the diffuser windows (11, 21) at an angular velocity (ω1,ω2) for homogenizing a diffusive pattern of the transmitted light beam (L1,L2). The diffuser windows (11,21) are configured to rotate around distinct rotation axes (C1,C2). The distinct rotation axes (C1,C2) are parallel and offset with respect to each other by a radial center distance (d12). A rotating subarea of the first diffuser window (11) partially overlaps a rotating subarea of the second rotating diffuser window (12) The partially overlapping rotating subareas define a beam window (W12)

(Continued)

for homogenizing and diffusing the transmitted light beam (L1,L2).

15 Claims, 4 Drawing Sheets

(58) Field of Classification Search
USPC .................................... 355/67, 71; 359/599
See application file for complete search history.

(56) References Cited

U.S. PATENT DOCUMENTS

| | | | |
|---|---|---|---|
| 2004/0021845 A1* | 2/2004 | Kawahara | G03F 7/70108 355/67 |
| 2004/0246574 A1 | 12/2004 | Engel et al. | |
| 2007/0274075 A1 | 11/2007 | Nagamune | |
| 2014/0300893 A1 | 10/2014 | Ogawa et al. | |

* cited by examiner

LIGHT BEAM DIFFUSER SYSTEM AND METHOD

TECHNICAL FIELD AND BACKGROUND

This application claims the benefit of International PCT Application No. PCT/NL2018/050318 filed May 15, 2018, which claims the benefit of the Netherlands Patent Application No. 2018926, filed May 16, 2017, the content of both of which are incorporated herein by reference in its entirety.

The present disclosure relates to optical diffuser systems and methods for diffusing a light beam.

Optical diffusers can be used to diffuse a light beam e.g. for homogenizing the light in an optical system such as used in lithography. For example, U.S. Pat. No. 7,148,952 describes a lithographic apparatus comprising an illumination system for providing a projection beam of radiation. The illumination system comprises at least one movable optical element, such that a projection beam of radiation can be shifted around a central position. According to the prior art, this ensures that inhomogeneities in the intensity distribution in the projection beam will be smeared out, which in turn provides an improved homogeneity of the exposure of a surface to be illuminated by the system, such as a wafer or other substrate. The optical element may comprise a motor movable mirror, prism, filter, lens, axicon, diffuser, diffractive optical array, optical integrator, etc.

US 2007/0274075 A1 describes a laser illuminator comprising at least one optical diffusion means capable of modifying an optical diffusion condition and at least one optical suppression means for suppressing divergence of light, wherein the optical diffusion means and the optical suppression means are disposed along an optical path of a laser beam radiating from a laser source and the laser beam is converted into a diffused and non-divergent light beam for illuminating or exciting an object by passing through the optical diffusion means and the optical suppression means.

In order to sufficiently smear out inhomogeneities the optical element should be moved with a minimum velocity. However, a rotating element such as a transmissive diffuser may have lower velocities at its center of rotation compared to the edge. Accordingly, the effective useable surface of the diffuser can be low and provide inconsistent smearing for different parts of the beam. There is a need to further improve known diffuser systems and methods to alleviate these and other problems.

SUMMARY

In one aspect, the present disclosure provides a diffuser system or method for optically diffusing a light beam. At least two transmissive diffuser windows are provided. The diffuser windows are arranged to sequentially diffuse the light beam transmitted there through. The diffuser system is configured to continuously rotate the diffuser windows at an angular velocity for homogenizing a diffusive pattern of the transmitted light beam. Advantageously, the diffuser windows are configured to rotate around distinct rotation axes. The distinct rotation axes are parallel and offset with respect to each other by a radial center distance. Accordingly, a rotating subarea of the first diffuser window partially overlaps a rotating subarea of the second rotating diffuser window. Thereby the partially overlapping rotating subareas define a beam window for homogenizing and diffusing the transmitted light beam.

As will be explained in further detail with reference to the figures below, transmitting a light beam sequentially through a pair of partially overlapping rotating diffuser windows may provide a more consistent relative movement of the diffuser surfaces. For example, at an area further away from a center of the first diffuser and closer to the center of the second diffuser, the surface of the first diffuser may move relatively fast while the second diffuser moves relatively slow. The same applies mutatis mutandis the other way around closer to the center of the first diffuser and further away from the center of the second diffuser. The relatively fast or slow moving surface of the first diffuser may thus at least partially compensate the relatively slow or fast moving surface, respectively, of the second diffuser. Accordingly, more consistent smearing can be obtained in the overlapping area of the diffuser windows. Furthermore, the area e.g. around the center of one diffuser may be covered by a moving surface of the other diffuser. Accordingly, the effective useable area may be improved and or material saved.

BRIEF DESCRIPTION OF DRAWINGS

These and other features, aspects, and advantages of the apparatus, systems and methods of the present disclosure will become better understood from the following description, appended claims, and accompanying drawing wherein:

DESCRIPTION OF EMBODIMENTS

Figure 1A:
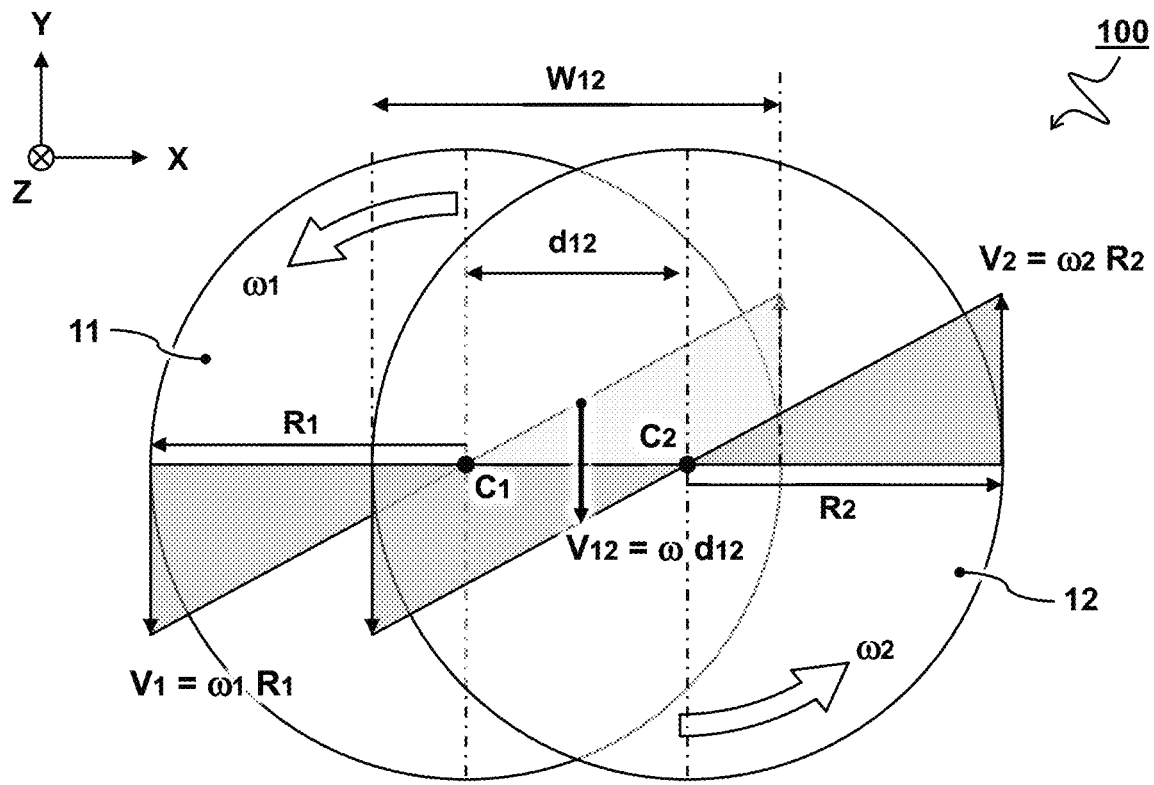
FIGS. 1A and 1B schematically illustrates principles of an embodiment of a diffuser system.

Terminology used for describing particular embodiments is not intended to be limiting of the invention. As used herein, the singular forms "a", "an" and "the" are intended to include the plural forms as well, unless the context clearly indicates otherwise. The term "and/or" includes any and all combinations of one or more of the associated listed items. It will be understood that the terms "comprises" and/or "comprising" specify the presence of stated features but do not preclude the presence or addition of one or more other features. It will be further understood that when a particular step of a method is referred to as subsequent to another step, it can directly follow said other step or one or more intermediate steps may be carried out before carrying out the particular step, unless specified otherwise. Likewise it will be understood that when a connection between structures or components is described, this connection may be established directly or through intermediate structures or components unless specified otherwise.

The invention is described more fully hereinafter with reference to the accompanying drawings, in which embodiments of the invention are shown. In the drawings, the absolute and relative sizes of systems, components, layers, and regions may be exaggerated for clarity. Embodiments may be described with reference to schematic and/or cross-section illustrations of possibly idealized embodiments and intermediate structures of the invention. In the description and drawings, like numbers refer to like elements throughout. Relative terms as well as derivatives thereof should be construed to refer to the orientation as then described or as shown in the drawing under discussion. These relative terms are for convenience of description and do not require that the system be constructed or operated in a particular orientation unless stated otherwise.

Figure 1B:
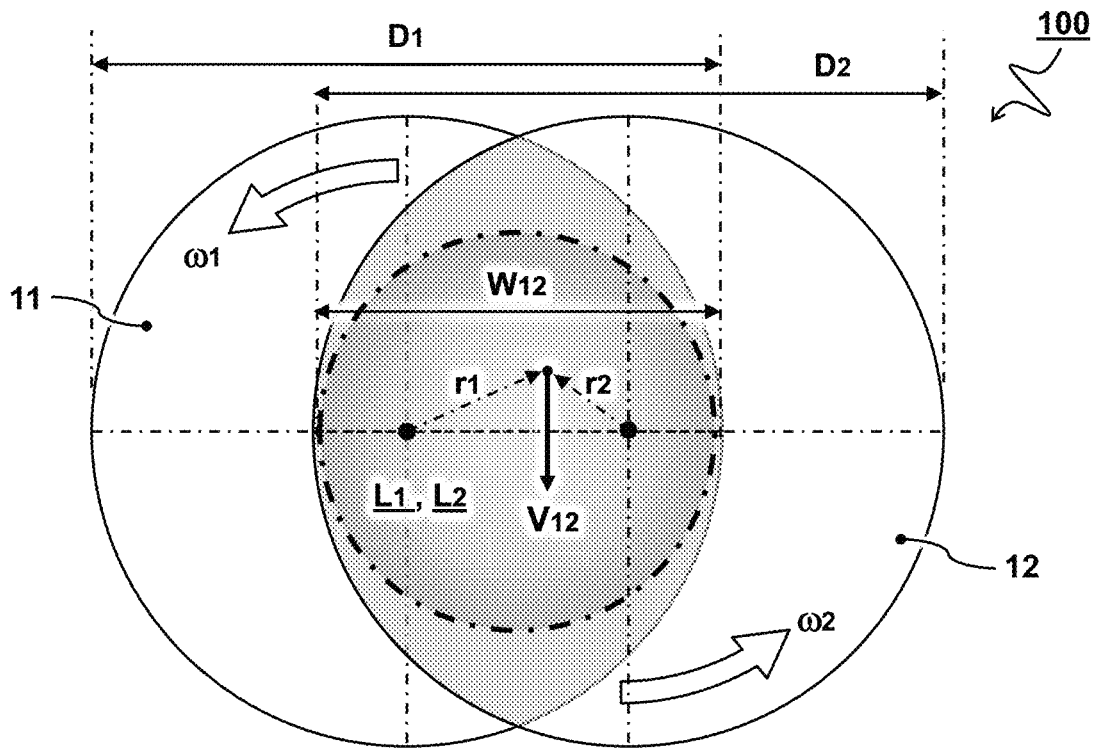

FIGS. 1A and 1B schematically illustrates principles of an embodiment of a light beam diffuser system 100.

In one embodiment, the system has at least two transmissive diffuser windows 11,21. The diffuser windows 11,21 are arranged to sequentially diffuse a transmitted light beam L1,L2. In other words, the light beam is first transmitted through the first diffuser window 11 before being transmitted through the second diffuser window 12. In one embodiment, the diffuser windows 11,21 are configured to continuously rotate at an angular velocity $\omega 1,\omega 2$ for homogenizing a diffusive pattern of the transmitted light beam L1,L2. As described herein, the diffuser windows 11,21 are configured to rotate around distinct rotation axes C1,C2. The distinct rotation axes C1,C2 are preferably parallel and offset with respect to each other by a radial center distance d12. In this way a rotating subarea of the first diffuser window 11 partially overlaps a rotating subarea of the second rotating diffuser window 12. The partially overlapping rotating subareas define a beam window W12 for homogenizing and/or diffusing the transmitted light beam L1,L2.

In a preferred embodiment, the diffuser windows 11,21 are configured to rotate with the same or almost the same angular velocity, i.e. $\omega 1=\omega 2$ or e.g. $0.9*\omega 1<\omega 2<1.1*\omega 1$. As shown in FIG. 1A, this may provide compensating velocity profiles for the surface velocities V1 and V2. In some embodiments, a small difference in angular velocity may be desired to prevent that the diffusers arrive at exactly the same relative position after one rotation. For example, the difference is such that after one rotation, one diffuser surface is shifted with respect to the other the diffusers surface by a at least the correlation distance Lc, e.g. more than ten micrometers. This may prevent undesired occurrence of a repetition pattern in the illumination. While the angular velocities $\omega 1,\omega 2$ are thus preferably the same or close together, this may not be always necessary to achieve at least some of the compensating effects as described herein. For example, even if the velocities are different, the lower velocities of one diffuser (e.g. at the center) may be at least partially compensated by the other diffuser.

In a preferred embodiment, the diffuser windows 11,21 are configured to rotate in the same angular direction. In other words both clockwise or both counterclockwise (e.g. from a front view of the diffuser system as depicted). By rotating in the same direction, the vector length of the relative surface velocity V12 determined by V12=|V1-V2| may be constant wherein the surfaces move in opposite directions in the area of overlap. While the angular directions are thus preferably the same, this may not be always necessary to achieve at least some of the compensating effects. For example even if the surfaces rotate in opposite directions ($\omega 1=-\omega 2$), the surfaces still both move with respect to the transmitted beam which may provide at least some homogenizing effect e.g. by cancelling part of the coherent speckle.

In preferred embodiments, the surfaces of the diffuser windows thus move with a relative surface velocity V12 that is constant over the beam window W12. For example, the diffuser windows 11,21 comprise or couple to respective actuation or rotation means (not shown here). The rotations means may in use cause the diffuser windows 11,21 to preferably rotate with the same angular velocity and/or the same direction.

In preferred embodiments, the diffuser windows 11,21 have the same diameter D1=D2 or radius R1=R2. This may provide the most effective use of diffuser material. For typical applications, e.g. in lithograph, preferably each of the diffuser windows 11,21 have a diameter D1,D2 between ten and two hundred millimeter, more preferably between fifty and hundred millimeter, e.g. around sixty or eighty millimeter. The larger the diffuser windows, the less beam intensity per surface area. Larger diffuser windows may also provide higher radial or surface velocity V1,V2 for a given angular velocity $\omega 1,\omega 2$. On the other hand, smaller diffuser windows may need less expensive material and save system space.

As illustrated in FIG. 1B, the diameter of the beam window W12 may be proportional to the diameters D1,D2 of the diffuser windows 11,21 and inversely proportional to the radial center distance d12. For example, it may be shown that W12=D−d12 where D=D1=D2.

At lower values for the radial center distance d12 the beam window W12 may be larger, but with a lower relative surface velocity V12 of the diffuser windows 11,21. When the radial center distance d12 is smaller than the radius R1,R2 or half the diameter D1,D2 of the diffuser windows 11,21, the relative surface velocity V12 between the surfaces may be smaller than the maximum velocities V1,V2 at the edges of the diffuser windows 11,21, but because the relative surface velocity V12 can actually be constant over the beam window W12, this constant relative surface velocity V12 can still be larger e.g. than the surface velocity of each of the diffuser windows 11,21 at their respective center points C1,C2 which normally has no surface movement. It will be appreciated that, by providing the radial center distance d12 smaller than the radius R1,R2 or half diameter D1,D2 of the diffuser windows 11,21, the beam window W12 can be relatively large, e.g. larger than the radius R1,R2 or half a diameter D1,D2 of either of the diffuser windows 11,21. A relatively large beam window W12 can e.g. be desired to save material cost for a relatively expensive diffuser material.

At higher values for the radial center distance d12, the relative surface velocity V12 of the diffuser windows 11,21 may be higher, but with a smaller beam window W12. When the radial center distance d12 is larger than the radius R1,R2 or half the diameter D1,D2 of the diffuser windows 11,21, the relative surface velocity V12 between the surfaces can actually be larger than the maximum velocities V1,V2 at the edges of the diffuser windows 11,21. So the individual angular velocities $\omega 1,\omega 2$ of the diffuser windows 11,21 can be lowered in principle while still achieving desired diffusion. This may be desired e.g. to reduce vibrations in a relatively inexpensive diffuser material.

Typically, a maximum circle fitting the beam window W12 has a diameter that is smaller than a diameter D1,D2 of the respective diffuser windows 11,21, e.g. between ten and ninety percent, preferably between twenty and eighty percent, more preferably between thirty and seventy percent. For example, the beam window W12 is between ten and hundred millimeter, more preferably between forty and sixty millimeter, e.g. a typical (expanded) beam size may have fifty-five millimeter diameter. Larger beam size may lower intensity per surface area but needing bulkier optics.

Figure 2A:
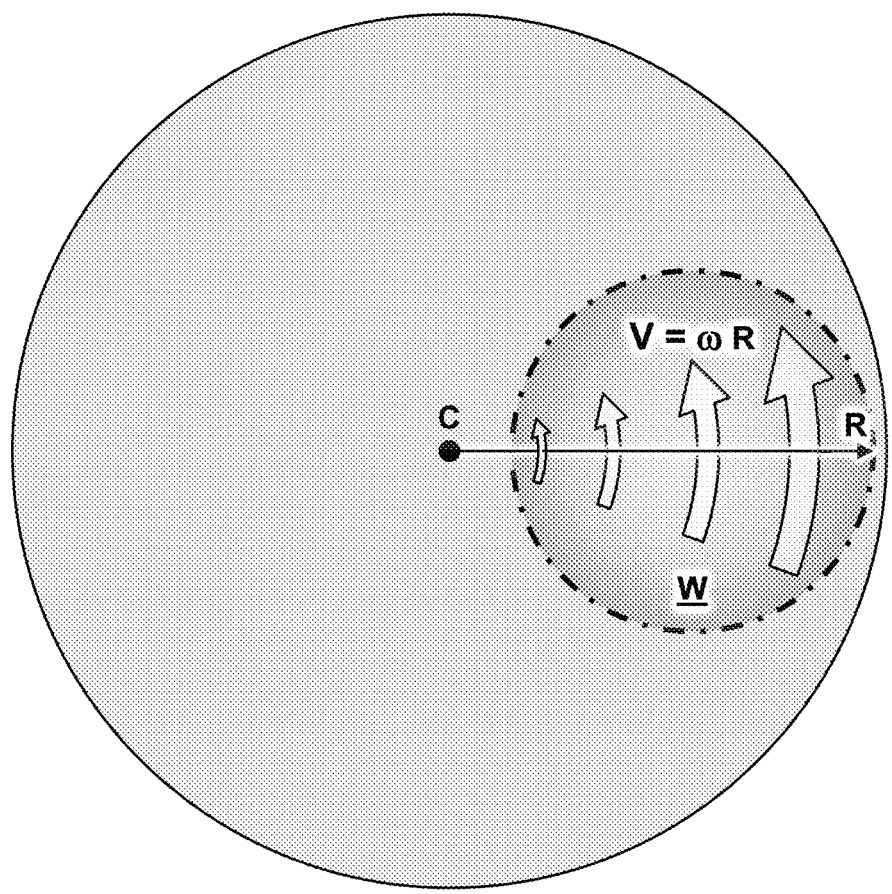
FIGS. 2A and 2B schematically compare a diffuser system with one rotating window to a diffuser system with two rotating windows.
Figure 2B:
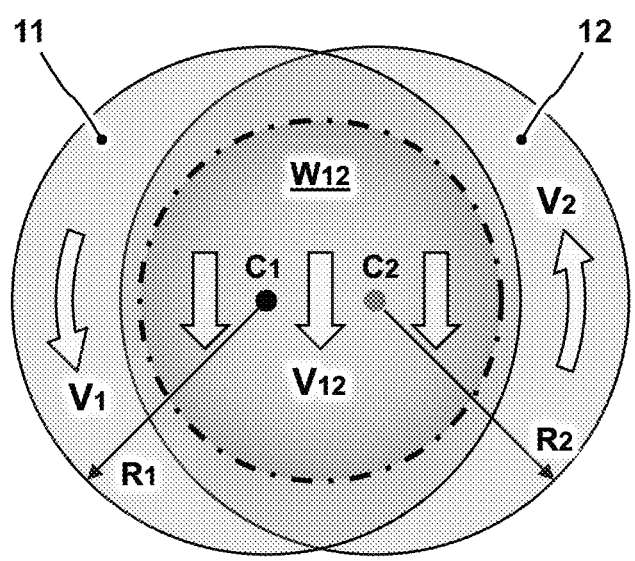

FIGS. 2A and 2B schematically illustrate how expensive diffuser material can actually be saved using two smaller windows (FIG. 2B) compared to one larger window (FIG. 2A). With reference to FIG. 2A, it is noted that a beam window W on a single rotating diffuser should not overlap the central rotation axis C as the surface velocity V=$\omega$ R may be too low at small radial distance R for providing desired smearing of the diffusion pattern. With reference to FIG. 2B, it will be appreciated that the beam window W12 may actually overlap the central rotation axes C1,C2 while even providing a more consistent relative surface velocity V12. Material cost can be save in some embodiments with the total surface of two smaller diffuser windows ($\pi \cdot R_1^{\wedge 2} + \pi \cdot R_2^{\wedge 2}$) being less than the surface of one bigger window ($\pi \cdot R^{\wedge 2}$). Alternatively, or in addition the relative surface velocity can be more consistent or even relatively higher at the same or lower angular velocity, especially when the radial center distance between the rotation axes C1,C2 is increased.

Figure 3:
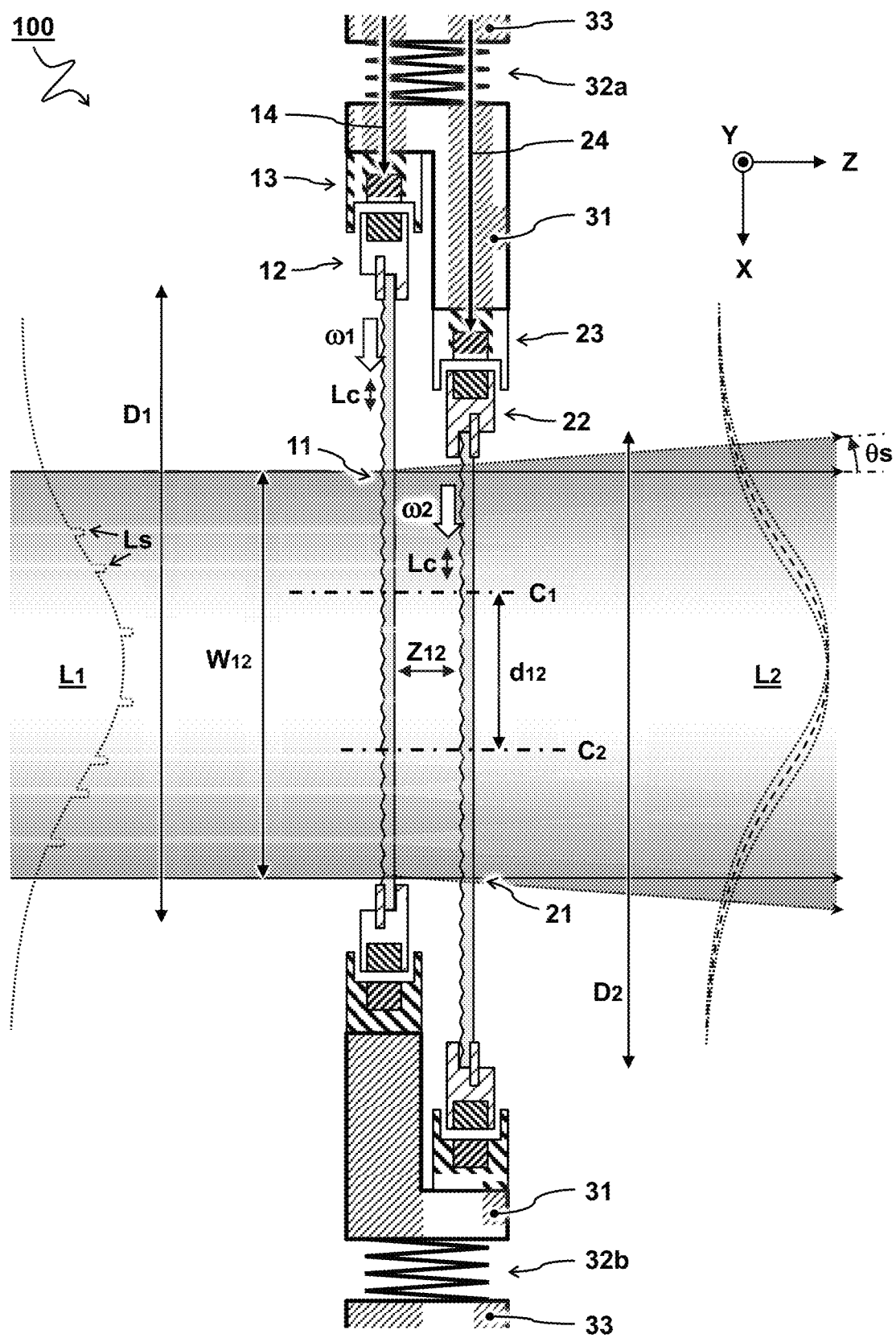
FIG. 3 schematically illustrates a cross-section side view of an embodiment a diffuser system.

FIG. 3 schematically illustrates a cross-section side view of an embodiment a diffuser system 100.

In a preferred embodiment, the diffuser windows 11,21 rotate in plane, i.e. without wobbling. In other words, the diffuser windows 11,21 are preferably arranged with their optical surfaces transverse to the incoming light beam L1,L2. Typically, the diffuser windows 11,21 have a diffuser angle defining an angular scatter of each of the diffuser windows 11,21 and/or a combined scattering angle θs as indicated. Preferably, the combined scattering angle θs is less than five degrees plane angle, preferably less than two degrees, less than one degree, or even less than half a degree, e.g. between 0.1-0.25 degrees. The smaller the better e.g. for less light being wasted.

In a preferred embodiment, the diffuser windows 11,21 are arranged with their surfaces parallel to each other at an axial distance Z12. For example, the axial distance Z12 is less than hundred millimeter, preferably less than fifty millimeter, less than twenty millimeter, or even less than ten millimeter, e.g. between one and five millimeter surface to surface distance. The closer the better, e.g. for reducing the combined scattering effect.

Typically, the diffuser windows 11,21 have a so-called correlation length Lc defining a minimum distance to move the surface of the diffuser windows 11,21 relative to the traversing light beam L1,L2 for homogenizing a coherent or correlated speckle L1s in the traversing light beam L1,L2. Preferably, the correlation length is less than hundred micrometer, less than fifty micrometer, or even less than ten micrometer, e.g. between one and five micrometer. The smaller the correlation length, the better, e.g. needing less movement of the surface to alleviate or cancel a coherent speckle pattern.

In some embodiments, the diffuser windows 11,21 comprise a surface structure for diffusing the transmitted light beam L1,L2, e.g. scattering occurs at the optical surfaces having a surface roughness or corrugations. In further embodiments, the surface structure determines the correlation length Lc. For example, the surface structure is an engineered surface structure for providing a consistent and predictable correlation length Lc. In other or further embodiments, the diffuser windows 11,21 comprise a diffusive transmissive material, e.g. wherein the light is scattered while traversing the material. In further embodiments, the transmissive material determines the correlation length Lc. Also combinations of these and other scattering effects are possible.

In the embodiment shown, the diffuser windows 11,21 are held (at their circumferential edge) by respective rotatable rings 12,22. The rotatable rings 12,22 rotate inside respective bearing structures 13,23. It will be appreciated that this may allow full use of the diffuser window surface, e.g. compared to holding the diffusers by a central axis, and can have particular advantage when the radial center distance d12 is smaller than the radius R1,R2 or half the diameter D1,D2 of the diffuser windows 11,21. In a preferred embodiment, the rotatable rings 12,22 and/or bearing structures 13,23 are provided with air bearings for smooth and/or low friction rotation. In a preferred embodiment, the rotatable rings 12,22 and/or bearing structures 13,23 are provided with a magnetic transmission to drive rotation of the diffuser windows 11,21. For example, the bearing structures 13,23 comprise electromagnets provided by electrical signals via signal lines 14,24 to drive respective magnets in the rotatable rings 12,22.

In the embodiment shown, both bearing structures 13,23 are fixed in a common frame 31. As shown, the bearing structures 13,23 can be radially offset according to the radial center distance d12 between the diffuser windows 11,21. Furthermore, the bearing structures 13,23 can be axially offset according to the axial distance Z12 between the diffuser windows 11,21. In a preferred embodiment, the common frame 31 is suspended by resilient means 32a,32b, e.g. springs. For example, the common frame 31 for the diffuser windows 11,21 is suspended to an external frame 33. The external frame 33 may be directly or indirectly connected to the rest of the optical system.

Figure 4:
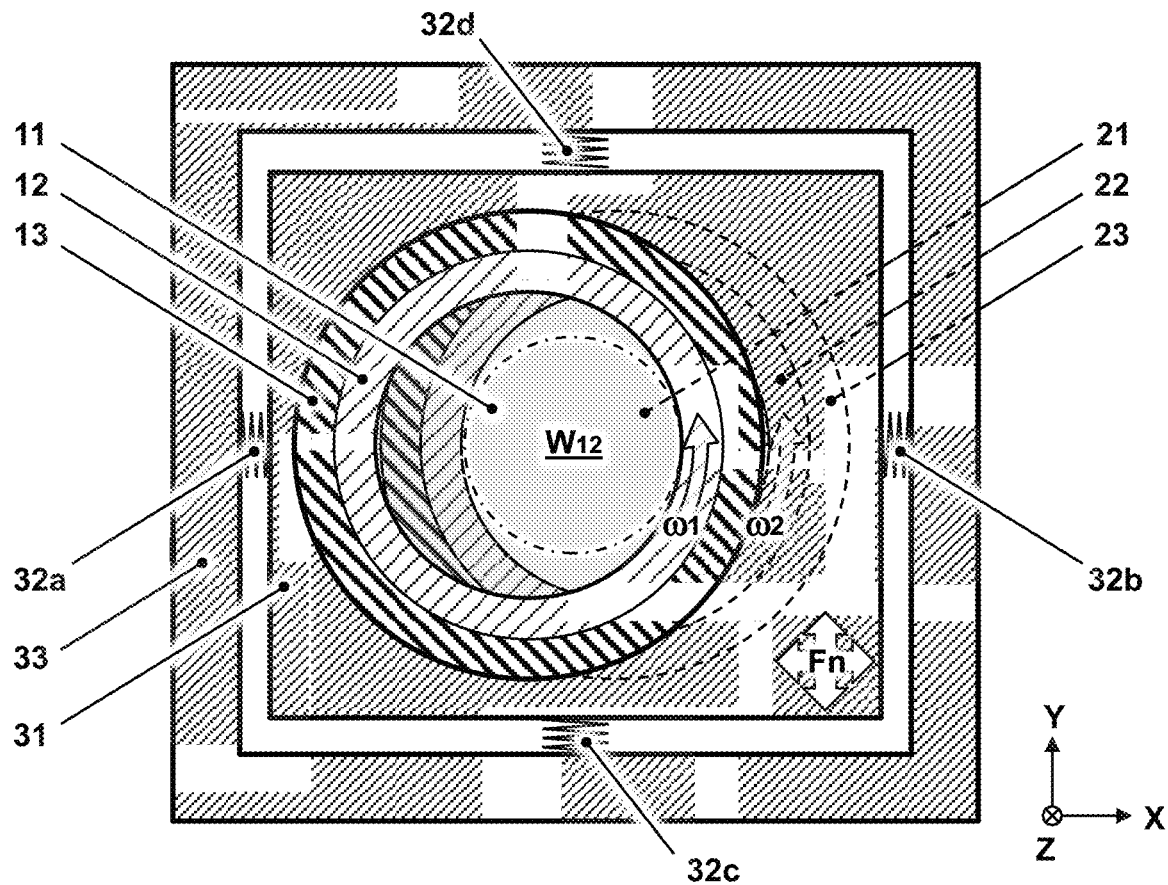
FIG. 4 schematically illustrates a front view of the embodiment.

FIG. 4 schematically illustrates a front view of the embodiment of the diffuser system 100 according to FIG. 3.

In the embodiment shown, the common frame 31 is suspended having a resonance or natural frequency Fn. In a preferred embodiment, the natural frequency Fn is lower than a rotation frequency of the diffuser windows 11,21. When the rotation frequency ($f=\omega/2\pi$) of the diffuser windows is higher than a natural frequency determined by the suspension, vibrations caused by the rotation may be less effectively coupled to the external frame 33. Preferably, the natural frequency Fn is at least a factor ten lower than the rotation frequency of the diffuser windows 11,21, more preferably at least a factor twenty, or more. For example, a mass of the components in the common frame 31 and a spring constant of the resilient means 32a-32d may be configured to determine a desired relatively low natural frequency Fn.

Figure 5:
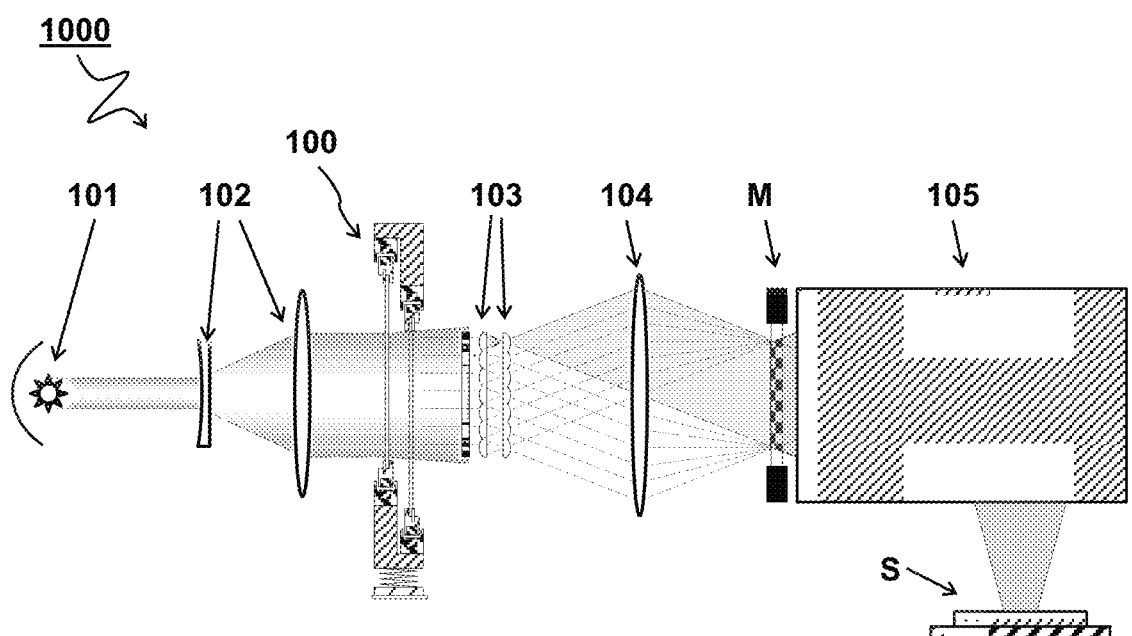
FIG. 5 schematically illustrates a side view of an embodiment for a lithography system comprising the diffuser system.

FIG. 5 schematically illustrates a side view of an embodiment for a lithography system 1000 comprising the diffuser system 100 as described herein.

Typically, the lithography system 1000 comprises or couples to a light source 101 configured to produce the light beam. For example, the light beam comprises actinic radiation for performing lithography. In some embodiments, the lithography system 1000 comprises or couples to a beam expander 102 to enlarge the beam. In the embodiment shown, the beam expander 102 comprises a pair of lenses. Preferably, the diffuser system 100 is placed in the expanded beam in an optical path after the beam expander 102 with less light intensity. In some embodiments, the lithography system 1000 comprises a lens array 103 e.g. for redistributing a Gaussian beam profile as a flat top profile. Optionally the lens array 103 may comprise an apodization mask to further shape the beam profile, as desired. Preferably, the diffuser system 100 is placed in a light path before the lens array 103 e.g. in the Gaussian beam profile which may suffer less edge effects. In the embodiment shown, the lithography system 1000 comprises a Fourier lens 104 for projecting a homogenous light beam onto a mask pattern M. As schematically indicated by the block the lithography system 1000 typically comprises a projection system 105 configured to project the mask pattern onto a wafer or substrate S, e.g. held by a substrate table 106.

Typically, the light source 101 is configured to provide a predetermined light pulse interval T, i.e. time between pulses which is the inverse of the pulse frequency. As described herein, it may be preferred that the relative surface velocity (V12, e.g. shown in FIG. 1A and FIG. 1B) is at least equal to the correlation length (Lc, e.g. shown in FIG. 3) divided by said light pulse interval T. Also higher velocity factors may be used. The velocity factor may e.g. determine whether distinct positions of the diffuser windows are sampled for exposures by subsequent light pulses, so that their speckle patterns are uncorrelated. Higher velocities may be preferable but may be limited by practical applications. For example, to sample distinct parts of the surface of a diffuser having a correlation length Lc=10 μm within a light pulse interval T of 5 μs (200 kHz), the relative surface velocity V12 is preferably at least 10 μm/5 μs=2 m/s. This can e.g. be achieved by a pair of diffusers at radial center distance d12=20 mm and rotating at angular velocity ω=100 rad/s (=955 revolutions per minute) and (V12=ω·d12=100·20 mm=2 m/s)

According to some aspects, the present disclosure relates also to corresponding methods for diffusing a light beam. In some embodiments, the method comprises providing at least two transmissive diffuser windows, e.g. wherein the diffuser windows, are arranged to sequentially diffuse a transmitted light beam, wherein the diffuser windows, continuously rotate at an angular velocity for homogenizing a diffusive pattern of the transmitted light beam, wherein the diffuser windows, rotate around distinct rotation axes, wherein the distinct rotation axes are parallel and offset with respect to each other by a radial center distance, wherein a rotating subarea of the first diffuser window partially overlaps a rotating subarea of the second rotating diffuser window, wherein the partially overlapping rotating subareas define a beam window for homogenizing and diffusing the transmitted light beam. In preferred embodiments, the diffuser windows have a correlation length Lc and the light source provides a light pulse interval T, wherein the angular velocity ω times the radial center distance d12 is at least equal to the correlation length Lc divided by the light pulse interval T (or multiplied by the light pulse frequency).

For the purpose of clarity and a concise description, features are described herein as part of the same or separate embodiments, however, it will be appreciated that the scope of the invention may include embodiments having combinations of all or some of the features described. For example, while embodiments were shown for transmissive diffusers, also alternative ways may be envisaged by those skilled in the art having the benefit of the present disclosure for achieving a similar function and result. For example, optical elements may be combined or split up into one or more alternative components. The various elements of the embodiments as discussed and shown offer certain advantages, such as improving beam homogeneity. Of course, it is to be appreciated that any one of the above embodiments or processes may be combined with one or more other embodiments or processes to provide even further improvements in finding and matching designs and advantages. It is appreciated that this disclosure offers particular advantages to lithographic systems, and in general can be applied for any application of beam homogenization.

In interpreting the appended claims, it should be understood that the word "comprising" does not exclude the presence of other elements or acts than those listed in a given claim; the word "a" or "an" preceding an element does not exclude the presence of a plurality of such elements; any reference signs in the claims do not limit their scope; several "means" may be represented by the same or different item(s) or implemented structure or function; any of the disclosed devices or portions thereof may be combined together or separated into further portions unless specifically stated otherwise. Where one claim refers to another claim, this may indicate synergetic advantage achieved by the combination of their respective features. But the mere fact that certain measures are recited in mutually different claims does not indicate that a combination of these measures cannot also be used to advantage. The present embodiments may thus include all working combinations of the claims wherein each claim can in principle refer to any preceding claim unless clearly excluded by context.

The invention claimed is:

1. A diffuser system for optically diffusing a light beam, the diffuser system comprising: at least two transmissive diffuser windows, wherein the diffuser windows are arranged to sequentially diffuse the light beam transmitted there through, wherein the diffuser system is configured to continuously rotate the diffuser windows at an angular velocity for homogenizing a diffusive pattern of the transmitted light beam, wherein the diffuser windows are configured to rotate around distinct rotation axes, wherein the distinct rotation axes are parallel and offset with respect to each other by a radial center distance, wherein a rotating subarea of the first diffuser window partially overlaps a rotating subarea of the second rotating diffuser window, wherein the partially overlapping rotating subareas define a beam window for homogenizing and diffusing the transmitted light beam, wherein the diffuser windows are held by respective rotatable rings, wherein the rotatable rings are configured to rotate inside respective bearing structures, wherein the radial center distance is smaller than a radius or half a diameter of the diffuser windows.

2. The diffuser system according to claim 1, wherein the bearing structures of both diffuser windows are fixed in a common frame.

3. The diffuser system according to claim 2, wherein the common frame is suspended with a resonance or natural frequency, wherein the natural frequency is lower than a rotation frequency of the diffuser windows.

4. The diffuser system according to claim 1, wherein the beam window is larger than the a radius or half the diameter of the diffuser windows.

5. The diffuser system according to claim 1, comprising rotation means configured to rotate the diffuser windows with the same angular velocity.

6. The diffuser system according to claim 1, comprising rotation means configured to rotate the diffuser windows in the same angular direction.

7. The diffuser system according to claim 1, wherein surfaces of the diffuser windows are configured to move with a relative surface velocity that is constant over the beam window.

8. The diffuser system according to claim 1, wherein the diffuser windows have the same diameter or radius.

9. The diffuser system according to claim 1, wherein the beam window has a diameter that is smaller than a diameter of the respective diffuser windows.

10. The diffuser system according to claim 1, wherein the diffuser windows rotate in plane.

11. The diffuser system according to claim 1, wherein the diffuser windows are arranged with their surfaces parallel to each other at an axial distance, wherein the axial distance is less than fifty millimeter.

12. The diffuser system according to claim 1, wherein the diffuser windows comprise a surface structure for diffusing the transmitted light beam.

13. A lithography system comprising: a diffuser system for optically diffusing a light beam, the diffuser system comprising at least two transmissive diffuser windows, wherein the diffuser windows are arranged to sequentially diffuse the light beam transmitted there through, wherein the diffuser system is configured to continuously rotate the diffuser windows at an angular velocity for homogenizing a diffusive pattern of the transmitted light beam, wherein the diffuser windows are configured to rotate around distinct rotation axes, wherein the distinct rotation axes are parallel and offset with respect to each other by a radial center distance, wherein a rotating subarea of the first diffuser window partially overlaps a rotating subarea of the second rotating diffuser window, wherein the partially overlapping rotating subareas define a beam window for homogenizing and diffusing the transmitted light beam, wherein the diffuser windows are held by respective rotatable rings, wherein the rotatable rings are configured to rotate inside respective bearing structures, wherein the radial center distance is smaller than a radius or half a diameter of the diffuser windows.

14. The lithography system according to claim 13, wherein surfaces of the diffuser windows are configured to move with a relative surface velocity that is constant over the beam window equal to the angular velocity times the radial center distance, wherein the diffuser windows have a correlation length defining a minimum distance to move the surface of the diffuser windows relative to the traversing light beam for homogenizing a coherent or correlated speckle in the traversing light beam, wherein the lithography system comprises to a light source configured to produce the light beam, wherein the light source is configured to provide a predetermined light pulse interval, wherein the relative surface velocity is at least equal to the correlation length divided by the light pulse interval.

15. A method for diffusing a light beam, the method comprising: providing at least two transmissive diffuser windows, wherein the diffuser windows are arranged to sequentially diffuse a transmitted light beam, wherein the diffuser windows continuously rotate at an angular velocity for homogenizing a diffusive pattern of the transmitted light beam, wherein the diffuser windows rotate around distinct rotation axes, wherein the distinct rotation axes are parallel and offset with respect to each other by a radial center distance, wherein a rotating subarea of the first diffuser window partially overlaps a rotating subarea of the second rotating diffuser window, wherein the partially overlapping rotating subareas define a beam window for homogenizing and diffusing the transmitted light beam, wherein the diffuser windows are held by respective rotatable rings, wherein the rotatable rings rotate inside respective bearing structures, wherein, the radial center distance is smaller than a radius or half a diameter of the diffuser windows.

\* \* \* \* \*